US008531245B2

(12) United States Patent
Joubert et al.

(10) Patent No.: US 8,531,245 B2
(45) Date of Patent: Sep. 10, 2013

(54) TEMPERATURE COMPENSATION IN A PLL

(75) Inventors: Cyril Joubert, Grenoble (FR); Sebastien Rieubon, St-Jean-de-Moirans (FR)

(73) Assignee: ST-Ericsson SA, Plan les Ouates (FR)

( * ) Notice: Subject to any disclaimer, the term of this patent is extended or adjusted under 35 U.S.C. 154(b) by 0 days.

(21) Appl. No.: 13/283,843

(22) Filed: Oct. 28, 2011

(65) Prior Publication Data

US 2013/0106476 A1    May 2, 2013

(51) Int. Cl.
*H03L 7/097*  (2006.01)
*H03L 7/085*  (2006.01)

(52) U.S. Cl.
USPC ............... 331/16; 331/17; 331/34; 331/10; 331/176; 331/179

(58) Field of Classification Search
USPC ............ 331/16, 176, 179, 17, 34, 36 C, 10, 331/117 R, 117 FE
See application file for complete search history.

(56) References Cited

U.S. PATENT DOCUMENTS

| 6,853,261 | B1 | 2/2005 | Ling |
| 7,046,093 | B1* | 5/2006 | McDonagh et al. ............ 331/16 |
| 7,711,340 | B2* | 5/2010 | Kim et al. .................... 455/260 |
| 2005/0052250 | A1 | 3/2005 | Tanzawa |
| 2006/0097796 | A1* | 5/2006 | Gomez ........................ 331/16 |
| 2006/0258313 | A1 | 11/2006 | Uozumi et al. |
| 2007/0159261 | A1* | 7/2007 | Lee ............................... 331/16 |
| 2007/0176691 | A1 | 8/2007 | Batchelor et al. |
| 2010/0301910 | A1* | 12/2010 | Hu et al. ...................... 327/156 |

FOREIGN PATENT DOCUMENTS

| WO | 03077422 A2 | 9/2003 |
| WO | 2005101664 A1 | 10/2005 |

* cited by examiner

*Primary Examiner* — Ryan Johnson
(74) *Attorney, Agent, or Firm* — Howison & Arnott, L.L.P.

(57) ABSTRACT

A method and apparatus for compensating for temperature variation in a phase locked loop (PLL) includes receiving an error signal by a controller in which the error signal representative of an instantaneous frequency difference between a reference frequency signal and an output frequency signal of a voltage controlled oscillator of the PLL, and determining when a voltage of the error signal is outside of a predetermined voltage range. When the voltage is outside the predetermined voltage range, the method includes generating a new digital compensation signal based upon a previous digital compensation signal, and converting the new digital compensation signal to be an analog compensation signal. The method further includes filtering the analog compensation signal by a filter to produce a filtered analog compensation signal, and adjusting the output frequency of the voltage controlled oscillator in accordance with the filtered analog compensation signal.

32 Claims, 6 Drawing Sheets

TEMPERATURE COMPENSATION IN A PLL

TECHNICAL FIELD

Embodiments of the invention relate to phase locked loops for use in communication and more particularly to temperature compensation in phase locked loops.

BACKGROUND

In mobile communication systems, phase locked loops (PLLs) are widely used as frequency synthesizers to generate the "carrier frequency" used to transmit and receive broadcast signals. Generally, a frequency synthesizer PLL is composed of a phase comparator which includes a phrase frequency detector, a loop filter, a voltage controlled oscillator (VCO), and a feedback frequency divider (/N) in a feedback loop. In a closed-loop mode, the PLL continuously compares the output frequency of the VCO through the feedback loop with a reference frequency signal. When the output of the VCO moves away from the reference signal, an error voltage is generated and filtered and is used as a control signal to bring the VCO into synchronization. In order to achieve a frequency synthesizer combining multiband, multi-standard, and high performance constraints, such as area, power consumption, and noise suppression, the VCO must be capable of operating over a large frequency range on the order of a few Gigahertz. However, a problem with existing PLLs is that temperature variations within the PLL circuitry can cause VCO frequency drift. If the VCO frequency drifts beyond acceptable limits, the PLL may unlock and communication will be lost.

SUMMARY

An embodiment of a method for compensating for temperature variation in a phase locked loop (PLL) includes receiving an error signal by a controller in which the error signal representative of an instantaneous frequency difference between a reference frequency signal and an output frequency signal of a voltage controlled oscillator of the phase locked loop (PLL), and determining when a voltage of the error signal is outside of a predetermined voltage range. When the voltage is outside the predetermined voltage range, the method includes generating a new digital compensation signal by a controller based upon a previous digital compensation signal in which the new digital compensation signal representative of a calibration signal for the voltage controlled oscillator, and converting the new digital compensation signal to be an analog compensation signal. When the voltage is within the predetermined voltage range, the method includes maintaining the previous digital compensation signal by the controller, and converting the previous digital compensation signal to be the analog compensation signal. The method further includes filtering the analog compensation signal by a filter to produce a filtered analog compensation signal, and adjusting the output frequency of the voltage controlled oscillator in accordance with the filtered analog compensation signal.

In some embodiments, the predetermined voltage range includes a first threshold voltage value and a second threshold voltage value in which the first threshold voltage value being less than the second threshold voltage value.

In some embodiments, when the voltage of the error signal is less than the first threshold voltage value, the step of generating further includes decrementing the previous digital compensation signal to produce the new digital compensation signal when a gain of the voltage controlled oscillator and a gain of the controller have the same signs, and incrementing the previous digital compensation signal to produce the new digital compensation signal when a gain of the voltage controlled oscillator and a gain of the controller have different signs.

In some embodiments, the decrementing or incrementing of the previous digital compensation signal occurs during a predetermined time period in a memorization mode of the filter.

In some embodiments, decrementing the previous digital compensation signal includes decrementing the previous digital compensation signal by one least significant bit (LSB), and incrementing the previous digital compensation signal includes incrementing the previous digital compensation signal by one least significant bit (LSB).

In some embodiments, when the voltage of the error signal is greater than the second threshold voltage value, the step of generating further includes incrementing the previous digital compensation signal to produce the new digital compensation signal when a gain of the voltage controlled oscillator and a gain of the controller have the same signal, and decrementing the previous digital compensation signal to produce the new digital compensation signal when a gain of the voltage controlled oscillator and a gain of the controller have different signs.

In some embodiments, the step of adjusting the output frequency of the voltage controlled oscillator includes adjusting the voltage of the error signal in accordance with the filtered analog compensation signal.

In some embodiments, the step of adjusting the output frequency of the voltage controlled oscillator includes adjusting at least one voltage controlled capacitance of the voltage controlled oscillator in accordance with the filtered analog compensation signal. In some embodiments, the at least one voltage controlled capacitance comprises at least one varactor.

In some embodiments, the step of adjusting the output frequency of the voltage controlled oscillator includes adding the filtered analog compensation signal to the error signal.

In some embodiments, the filtering comprises low-pass filtering the analog compensation signal.

In some embodiments, the method further includes providing a temperature signal to the controller, the temperature signal indicative of a temperature measured by a temperature sensor, and setting a value of the previous digital compensation signal in accordance with the temperature signal.

In some embodiments, the method further includes switching the filter between an open-loop VCO calibration mode in which the filter is disabled, a PLL settling mode in which the filter is configured for a large bandwidth, and a closed-loop compensation mode in which the filter is enabled.

In some embodiments, a cut-off frequency of the filter is lower than a cut-off frequency of the PLL.

In some embodiments, the method further includes receiving a control signal by the controller, wherein the generating of the new digital compensation signal by the controller is performed in response to receiving the control signal. In some embodiments, the method further includes generating the control signal in response to determining that the voltage of the error signal is outside of a predetermined voltage range.

An apparatus having a phase locked loop includes a voltage controlled oscillator of the phase locked loop (PLL). The voltage controlled oscillator is configured to output an output frequency signal in accordance with an error signal. The error signal is representative of an instantaneous frequency difference between a reference frequency signal and the output frequency signal of the voltage controlled oscillator. The apparatus further includes a controller configured to receive the error signal, and determine when a voltage of the error signal is outside of a predetermined voltage range. When the voltage is outside the predetermined voltage range, the controller is further configured to generate a new digital compensation signal based upon a previous digital compensation signal in which the new digital compensation signal representative of a calibration signal for the voltage controlled oscillator, and convert the new digital compensation signal to be an analog compensation signal. When the voltage is outside the predetermined voltage range, the controller is further configured to maintain the previous digital compensation signal, and convert the previous digital compensation signal to be the analog compensation signal. The apparatus further includes a filter configured to receive the analog compensation signal from the controller and filter the analog compensation signal to produce a filtered analog compensation signal. The voltage controlled oscillator is further configured to adjust the output frequency in accordance with the filtered analog compensation signal.

In some embodiments, the predetermined voltage range includes a first threshold voltage value and a second threshold voltage value in which the first threshold voltage value being less than the second threshold voltage value.

In some embodiments, when the voltage of the error signal is less than the first threshold voltage value, the generating includes decrementing the previous digital compensation signal to produce the new digital compensation signal when a gain of the voltage controlled oscillator and a gain of the controller have the same signs, and incrementing the previous digital compensation signal to produce the new digital compensation signal when a gain of the voltage controlled oscillator and a gain of the controller have different signs.

In some embodiments, the decrementing or incrementing of the previous digital compensation signal occurs during a predetermined time period in a memorization mode of the filter.

In some embodiments, decrementing the previous digital compensation signal includes decrementing the previous digital compensation signal by one least significant bit (LSB), and incrementing the previous digital compensation signal includes incrementing the previous digital compensation signal by one least significant bit (LSB).

In some embodiments, when the voltage of the error signal is greater than the second threshold voltage value, the generating includes incrementing the previous digital compensation signal to produce the new digital compensation signal when a gain of the voltage controlled oscillator and a gain of the controller have the same signs, and decrementing the previous digital compensation signal to produce the new digital compensation signal when a gain of the voltage controlled oscillator and a gain of the controller have different signs.

In some embodiments, adjusting the output frequency of the voltage controlled oscillator includes adjusting the voltage of the error signal in accordance with the filtered analog compensation signal.

In some embodiments, the apparatus further includes at least one voltage controlled capacitance coupled to the voltage controlled oscillator, wherein adjusting the output frequency of the voltage controlled oscillator includes adjusting the at least one voltage controlled capacitance in accordance with the filtered analog compensation signal. In some embodiments, the at least one voltage controlled capacitance comprises at least one varactor.

In some embodiments, the step of adjusting the output frequency of the voltage controlled oscillator includes adding the filtered analog compensation signal to the error signal.

In some embodiments, the apparatus further includes a temperature sensor coupled to the controller. The temperature sensor is configured to provide a temperature signal to the controller in which the temperature signal is indicative of a temperature measured by the temperature sensor. The controller is further configured to set a value of the previous digital compensation signal in accordance with the temperature signal.

In some embodiments, the controller is further configured to switch the filter between an open-loop VCO calibration mode in which the filter is disabled, a PLL settling mode in which the filter is configured for a large bandwidth, and a closed-loop compensation mode in which the filter is enabled.

In some embodiments, the filter comprises a low-pass filter. In some embodiments, a cut-off frequency of the filter is lower than a cut-off frequency of the PLL.

In some embodiments, the controller is further configured to receive a control signal, wherein the generating of the new digital compensation signal by the controller is performed in response to receiving the control signal. In some embodiments, the control signal is generated in response to determining that the voltage of the error signal is outside of a predetermined voltage range.

BRIEF DESCRIPTION OF THE DRAWINGS

For a more complete understanding, reference is now made to the following description taken in conjunction with the accompanying Drawings in which.

DETAILED DESCRIPTION

Referring now to the drawings, wherein like reference numbers are used herein to designate like elements throughout, the various views and embodiments of temperature compensation in a phase locked loop (PLL) are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Various embodiments provide for a method and apparatus for compensating for temperature variation in a phase locked loop (PLL) without interrupting communications and without the need for temperature information provided from a temperature sensor. In various embodiments, an analog error signal used to control a voltage controlled oscillator (VCO) of the PLL is monitored by a threshold voltage detector of a controller during closed loop communication. When this monitored analog error signal is out of an acceptable voltage range, a digital control unit increases or decreases a digital compensation signal generated by the digital control unit. The digital compensation signal is converted into an analog ramp by a digital-to-analog converter (DAC) and filtered by a low-pass filter to produce a filtered analog compensation signal. The filtered analog compensation signal is provided to the voltage controlled oscillator (VCO) to adjust the output frequency of the voltage controlled oscillator in accordance with the filtered analog compensation signal to maintain the output frequency of the voltage controlled oscillator (VCO) to the desired range or value. In some embodiments, the filtered analog compensation signal is used to control one or more varactor banks of the VCO to adjust the output frequency of the VCO to the desired range. In other embodiments, the filtered analog compensation signal is added to the analog voltage signal by a voltage adder to adjust the output frequency of the VCO to the desired range or value. In still other embodiments, the digital compensation signal may be preset during an open loop process-voltage-temperature (PVT) calibration mode by reading temperature information from a temperature sensor by the controller to preset an initial value of the digital compensation signal in order to increase the temperature operating range of the temperature variation compensation procedure.

Figure 1:
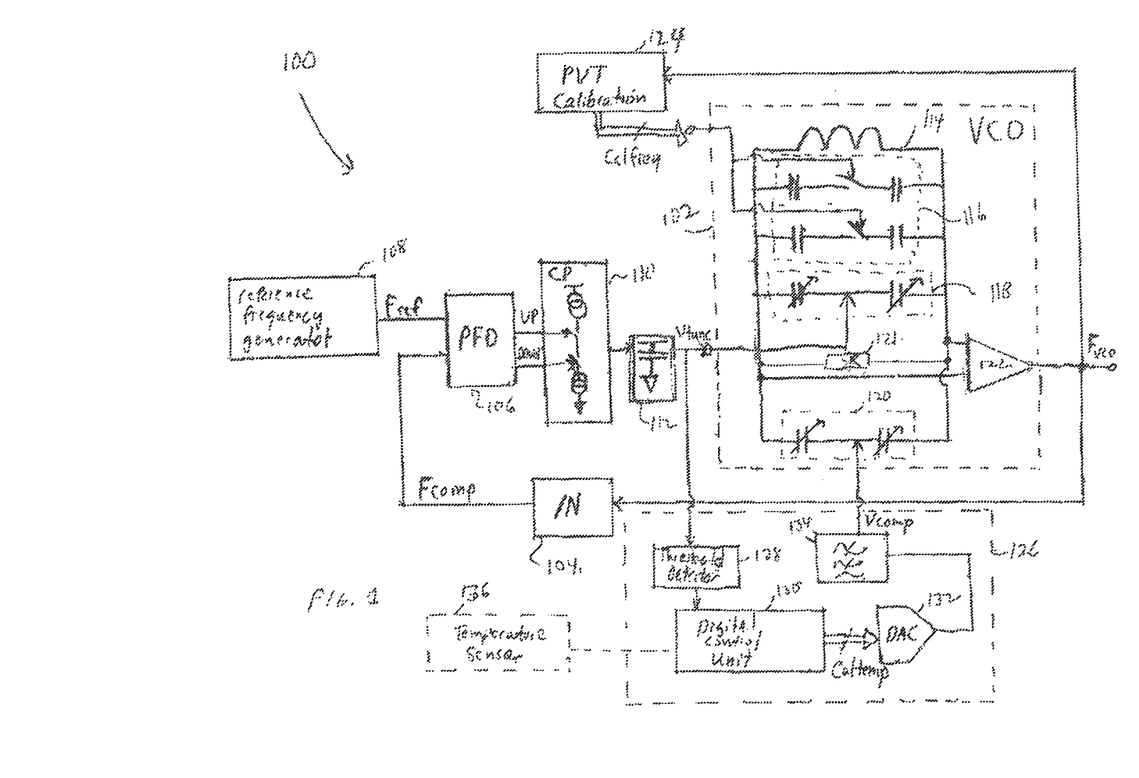
FIG. 1 illustrates a block diagram of an embodiment of circuitry for compensating for temperature variation in a phase locked loop (PLL) without interrupting existing communications.

FIG. 1 illustrates a block diagram of an embodiment of circuitry 100 for compensating for temperature variation in a phase locked loop (PLL) without interrupting existing communications. In at least one embodiment, the circuitry 100 is embodied in a transceiver of a mobile communication device such as a cell phone, smart phone, PDA, or any other mobile communication device. In still other embodiments, the circuitry 100 may be embodied in a microchip or other circuitry used in any type of device in which a PLL is used. The circuitry 100 includes a phase locked loop (PLL) comprised of a voltage controlled oscillator (VCO) 102, a feedback frequency divider (/N) 104, a phase frequency detector (PFD) 106, a reference frequency generator 108, a charge pump 110, and a loop filter 112. The VCO 102 operates to produce a periodic output frequency signal having a frequency $F_{VCO}$ that may be varied in accordance with an output error signal $V_{tune}$. The output of the VCO 102 is coupled to an input of the feedback divider 104. The feedback frequency divider 104 divides the output frequency $F_{VCO}$ produced by the VCO 102 by a predetermined ratio N to produce a comparison signal having a frequency $F_{COMP}$ and provides the comparison signal $F_{COMP}$ to a first input of the phase frequency detector 106 as a feedback loop. The reference frequency generator 108 produces a reference signal having a reference frequency $F_{REF}$ and provides the reference frequency $F_{REF}$ to a second input of the phase frequency detector 106. The PFD 106 detects a phase and frequency difference between the comparison signal $F_{COMP}$ which is feedback from the output of the VCO 102 and the reference frequency $F_{REF}$ received from the reference frequency generator 108 and produces output control signals to the charge pump 110 indicative of the phase difference. It should be understood that the PLL of various embodiments may be an analog PLL, a digital PLL, or any combination of analog and digital PLL.

In response to the control signals, the charge pump 110 generates an error signal that is representative of an instantaneous frequency difference between the reference frequency signal $F_{REF}$ and the comparison signal $F_{COMP}$. In a particular embodiment, the PFD 106 detects the difference in phase and frequency between $F_{REF}$ and $F_{COMP}$ and generates an up or down control signal based on whether the feedback frequency is lagging or leading the reference frequency and provides these up and down signals to the charge pump 110. If the charge pump 110 receives an up signal from the PFD 106, current is driven into the loop filter 112. If the charge pump 110 receives a down signal from the PFD 106, current is drawn from the loop filter 112. The loop filter 112 converts this error signal to an error signal $V_{tune}$ that is used to bias the VCO 102 so as to control the output frequency $F_{VCO}$ of the VCO 102. Based on the error signal, the VCO 102 oscillates at a higher or lower frequency which affects the phase and frequency of the feedback comparison signal $F_{COMP}$. If the PFD 106 produces an up signal, then the output frequency $F_{VCO}$ of the VCO 102 increases. If the PFD 106 produces a down signal, the output frequency $F_{VCO}$ of the VCO 102 decreases. The VCO 102 stabilizes once the reference frequency $F_{REF}$ and the comparison frequency from the feedback loop $F_{COMP}$ have substantially the same phase and frequency. The loop filter 112 is connected to the output of the charge pump 112 and filters out jitter in the error signal by removing glitches produced by the charge pump 110 and by preventing voltage overshoot. Once the reference frequency $F_{REF}$ and comparison frequency $F_{COMP}$ are aligned, the PLL is considered to be locked.

In a particular embodiment, the VCO 102 includes an inductor 114, a digitally-controlled capacitor bank 116, a varactor bank 118, a compensation varactor bank 120, a negative resistor 121, and an amplifier 122. The inductor 114, the digitally controller capacitor bank 116, the varactor bank 118, and the compensation varactor bank 120 are electrically connected in parallel with one another. A first and second side of each of the inductor 114, the digitally-controlled capacitor bank 116, the varactor bank 118, the compensation varactor bank 120, and the negative resistor 121 are electrically connected to first and second inputs, respectively, of the amplifier 122. The digitally-controlled capacitor bank 116, varactor bank 118 and compensation varactor bank 120 are configured as controllable capacitances which are used to adjust the output frequency $F_{VCO}$ of the VCO 102 in response to control inputs. The varactor bank 118 is controlled by the error signal $V_{tune}$ during closed loop operation of the PLL. The digitally-controlled capacitor bank 116 is controlled during an open loop process-voltage-temperature (PVT) calibration mode of the PLL, and the compensation varactor bank 120 is controlled during a closed loop temperature compensation mode of the PLL as will be further described herein. The negative resistor 121 is a component that exhibits negative resistance in a portion of its operating range. The negative resistor 121 is used to maintain the oscillation of the VCO 102 and compensates for the loss in the inductor 114 and capacitances of the VCO 102. In a particular embodiment, the negative resistance 121 is comprised of two or four transistors that generate a negative resistance. Although the embodiment illustrated in FIG. 1 shows two digitally-controlled capacitor banks 116, a single varactor bank 118, and a single compensation varactor bank 120, it should be understood that in various embodiments any number of desired digitally-controlled capacitor banks 116, varactor banks 118, and compensation varactor banks 120 may be used. In addition, although FIG. 1 is illustrated as using a compensation varactor bank which includes one or more varactors, it should be understood that in other embodiments any voltage controlled capacitance may be used.

The circuitry 100 further includes a process-voltage-temperature (PVT) calibration module 124 for use in the open-loop PVT calibration process which occurs when an existing communication using the PLL is not occurring. The PVT calibration module 124 has an input coupled to the output of the VCO 102 to receive the output frequency signal $F_{VCO}$ and an output coupled to control inputs of the digitally-controlled capacitor banks 116. During the PVT calibration process, the PVT calibration module 124 receives the output frequency signal $F_{VCO}$ from the VCO 102 and outputs a digital control word CALFREQ to the digitally-controlled capacitor banks 116. The digitally-controlled capacitor banks 116 include both course and fine caliber capacitor banks The value of the digital control word CALFREQ determines which of the coarse and fine banks are enabled in order to produce a desired output frequency $F_{VCO}$ from the VCO 102 during open loop PVT calibration. During open loop PVT calibration, the digitally-controlled capacitor banks 116 are calibrated to compensate for process-temperature-voltage (PVT) variations that cannot be changed after the locking of the PLL without causing a large output frequency drift. The open loop PVT calibration is performed by the PVT calibration module 124 measuring the output frequency $F_{VCO}$ for a fixed $V_{tune}$ value, $V_{cal}$, and outputting the digital control word CALFREQ corresponding to the desired output frequency $F_{VCO}$. In a particular embodiment, $C_{cal}$ is equal to half of the charge pump power supply.

Figure 2:
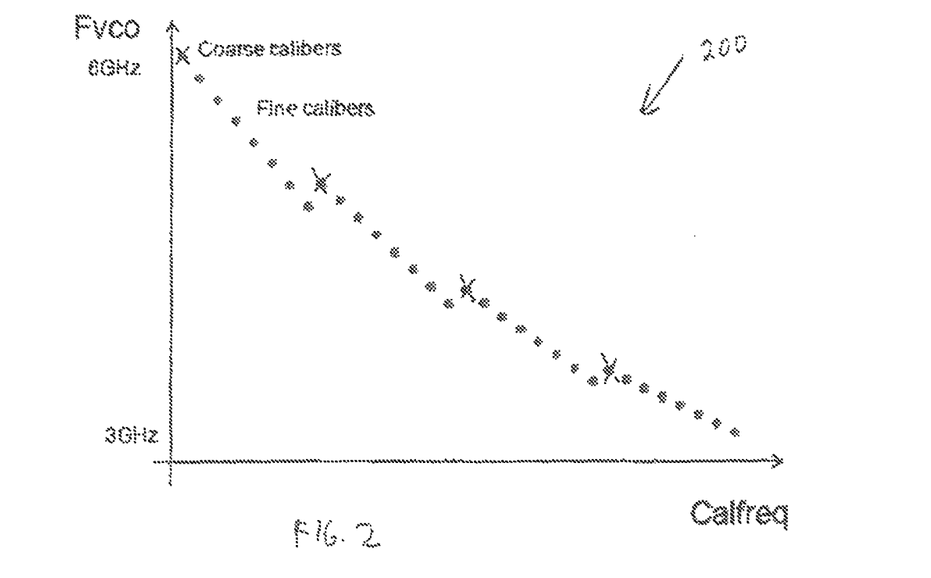
FIG. 2 illustrates a diagram of process-voltage-temperature (PVT) compensation for the digitally-controlled capacitor banks of FIG. 1 in the open loop PVT calibration mode.

FIG. 2 illustrates a diagram 200 of process-voltage-temperature (PVT) compensation for the digitally-controlled capacitor banks 116 of FIG. 1 in the open loop PVT calibration mode. As illustrated in FIG. 2, the digitally-controlled capacitor banks 116 include a number of coarse caliber banks (designated by the symbol X) and fine caliber banks (designated by the symbol •) which are configured to produce a particular output frequency $F_{VCO}$ for a particular digital control word CALFREQ. As can be seen in FIG. 2, the frequency curve produced by the digitally-controlled capacitor banks 116 produce a number of discontinuities.

Figure 3:
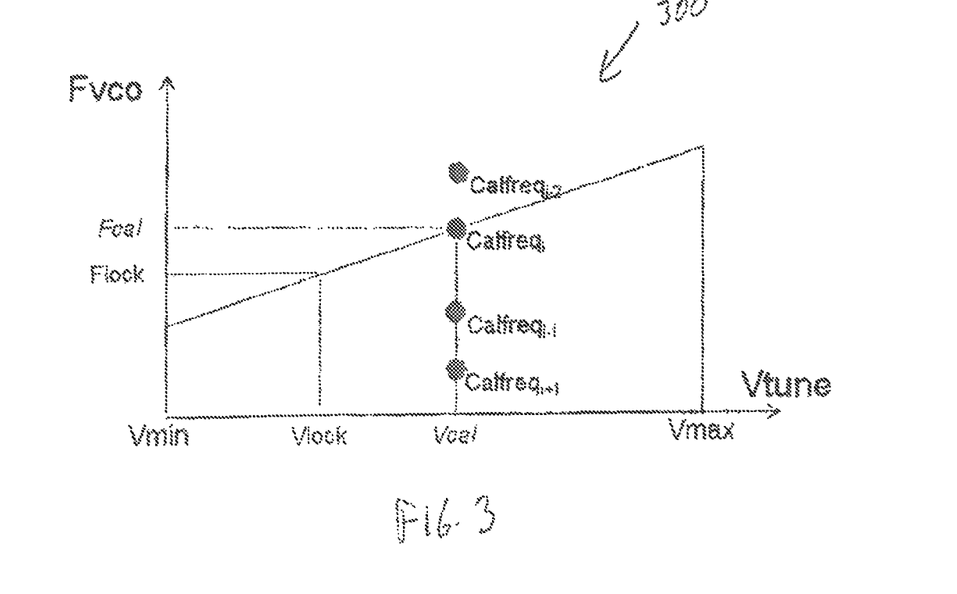
FIG. 3 illustrates a diagram of output frequency $F_{VCO}$ of the VCO vs. the error signal $V_{tune}$ during the closed loop mode.

FIG. 3 illustrates a diagram 300 of output frequency $F_{VCO}$ of the VCO 102 vs. the error signal $V_{tune}$ during the closed loop mode. The values of $V_{min}$ and $V_{max}$ depend on the charge pump power supply with a margin to assure good charge pump behavior. In the closed loop operation mode when a communication starts the PLL is calibrated and locked for a given temperature. If the communication lasts a long time, the temperature can vary wildly. During open loop PVT calibration, a value of the digital control word CALFREQ, is chosen by the PVT calibration module 124 from among a number of possible digital control words $CALFREQ_{i-2}$ to $CALFREQ_{i+1}$ to produce a calibration frequency $F_{cal}$. After the open loop PVT calibration is performed, the loop of the PVT calibration module 124 is closed, and the PLL is locked by adjusting $V_{tune}$ from $V_{cal}$ to a lock value $V_{lock}$ as further illustrated in FIG. 3.

Due to VCO temperature co-efficiency, a temperature variation will cause a VCO frequency drift, and the PLL will compensate for the temperature drift by adjusting the $V_{tune}$ voltage. If the $V_{tune}$ voltage is pushed away from acceptable limits, the PLL may unlock and a communication may be lost. This is especially true for technologies such as used in the Wideband Code Division Multiple Access (WCDMA) and the Long Term Evolution (LTE) communication standards that have a frequency division duplex (FDD) mode that requires maintaining the PLL locked during a long period of time over a large temperature range without including enough dedicated time between frames for a new PVT open loop calibration to be performed. The PVT calibration mode is used to calibrate for large frequency uncertainty due to processed-voltage-temperature (PVT) variations, however the PVT calibration mode is unable to compensate for temperature variations in the PLL during the closed loop mode in which existing communications are taking place.

Referring again to FIG. 1, the circuitry 100 further includes a controller 126 that is configured to provide temperature compensation in the PLL during closed loop mode without dropping an existing communication. The controller 126 has an input connected to the output of the loop filter 112 to receive the error signal $V_{tune}$ and an output connected to a control input of the compensation varactor bank 120 associated with the VCO 102. The controller 126 includes a threshold detector 128, a digital control unit 130, a digital-to-analog converter (DAC) 132, and a filter 134. The controller 126 is configured to maintain operational performance of the VCO 102 during closed loop communication by maintaining the error signal $V_{tune}$ signal within an optimal range without the need of temperature sensor information. The threshold detector 128 is configured to receive the error signal $V_{tune}$ and determine whether a voltage of the error signal is outside of a predetermined voltage range.

When a voltage of the error signal is outside the predetermined voltage range, the digital control unit 130 generates a digital compensation signal CALTEMP representative of a calibration signal for the VCO 102. In a particular embodiment, the threshold detector 128 generates a control signal that is indicative of a request to the digital control unit 130 to initiate the compensation procedure when the error signal $V_{tune}$ is outside the predetermined voltage range, and the digital control unit 130 generates the digital compensation signal CALTEMP in response to receiving the control signal. In still other embodiments, the digital control unit 130 generates the digital compensation signal CALTEMP in response to receiving an external control signal that is not dependent upon the error signal $V_{tune}$, in which case the threshold detector 128 functions to only measure the value of the error signal $V_{tune}$. The digital compensation signal CALTEMP is based upon a previous value of the digital compensation signal. In various embodiments, a first value of the digital compensation signal is set before open-loop PVT calibration and this first value is modified by the digital control unit when the voltage of the error signal is outside the predetermined voltage range. In a particular embodiment, the digital control unit 130 modifies the previous value of digital compensation signal CALTEMP by either increasing or decreasing the value of the digital compensation signal CALTEMP depending upon whether it is desired to increase or decrease the output frequency $F_{VCO}$ of the VCO 102 in order to maintain the output frequency $F_{VCO}$ in a desired range. In a particular embodiment, the digital control unit 130 increases or decreases the digital compensation signal CALTEMP by one least significant bit (LSB). The modified digital compensation signal is provided to the digital-to-analog converter 132 which converts the digital compensation signal CALTEMP to an analog compensation signal. The analog compensation signal is provided to the filter 134 which is configured to filter the analog compensation signal to produce a filtered analog compensation signal $V_{comp}$. In a particular embodiment, the filtered analog compensation signal $V_{comp}$ is in the form of an analog ramp. In some embodiments, incrementing and decrementing of the digital compensation signal CALTEMP occurs during a predetermined time period in a memorization mode of the filter 134 in which the filter memorizes the current value of $V_{comp}$.

When the voltage of the error signal is within the predetermined voltage range, the digital control unit 130 does not generate a new digital compensation signal CALTEMP, but instead maintains the current value of the digital compensation signal CALTEMP and converts the digital compensation signal CALTEMP to the analog compensation signal. The analog compensation signal is provided to the filter 134 which is configured to filter the analog compensation signal to produce a filtered analog compensation signal $V_{comp}$.

The filtered analog compensation signal $V_{comp}$ is provided to the control inputs of the compensation varactor bank 120 to control the capacitances of one or more varactors. By controlling the varactors of the compensation varactor bank 120, the output frequency $F_{VCO}$ of the VCO 102 is adjusted in accordance with the filtered analog compensation signal CALTEMP to bring the output frequency $F_{VCO}$ to the desired range in order to compensate for temperature variations during the closed loop mode. In a particular embodiment, the filter 134 is a low pass filter configured to suppress DAC noise and avoid large transient frequency error. In a particular embodiment, the bandwidth or cutoff frequency of the filter 134 is lower than the bandwidth or cutoff frequency of the PLL loop in order to reduce frequency grip to an acceptable level when the DAC is updated, such as to 0.1 ppm. A more detailed description of an embodiment of the closed loop temperate compensation procedure will be further discussed with respect to FIG. 4.

In an alternative embodiment, the circuitry 100 may further be provided with a temperature sensor 136 to provide temperature sensor information to the digital control unit 130 to increase the temperature operating range of the controller 126. The temperature sensor information is indicative of a temperature measured by the temperature sensor 136 and is used to preset a value of the digital compensation signal CALTEMP before open loop PVT calibration. Without such temperature information, before starting of PVT calibration the digital compensation signal CALTEMP may be preset at half of its range in order to absorb either increases or decreases in temperature during operation of the PLL. However by using this temperature information, the digital compensation signal CALTEMP may be preset according to the sensed temperature such as by using a lookup table mapping temperatures to preset values of the digital compensation signal CALTEMP or by performing a calculation to determine a preset value of the digital compensation signal CALTEMP based upon the sensed temperature. By a proper presetting of the digital compensation signal CALTEMP, the initial temperature operating range of the controller 126 may be extended up to twice that of an embodiment in which such temperature information is not provided.

Figure 4:
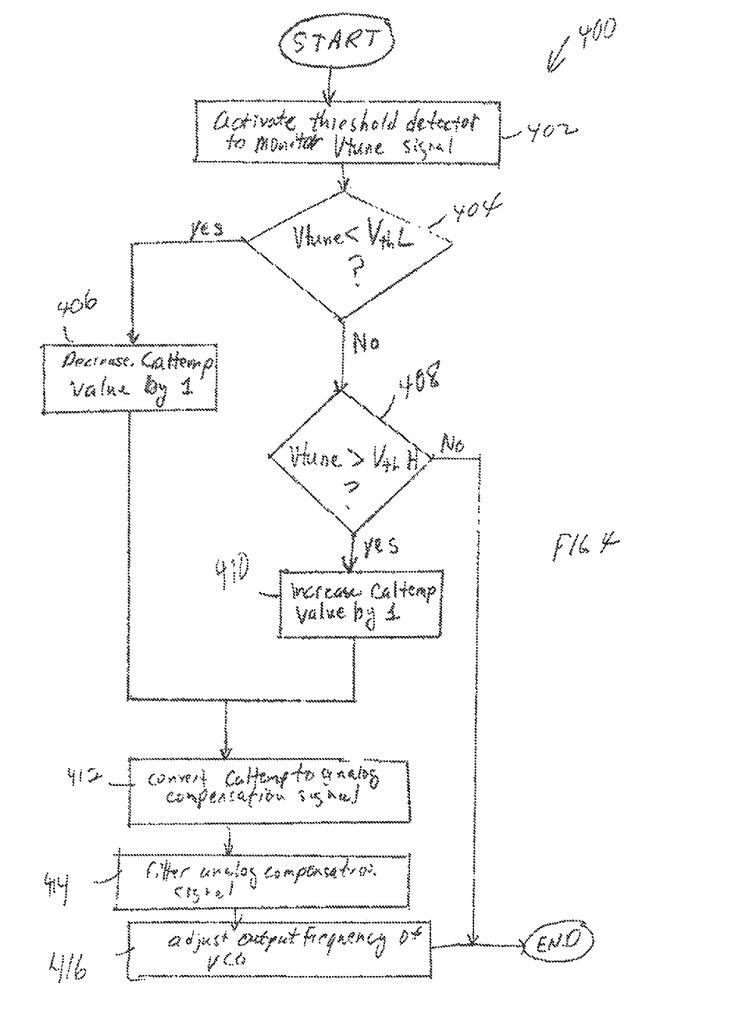
FIG. 4 illustrates an embodiment of a procedure for compensating for temperature variation in the phase locked loop (PLL) circuit of FIG. 1 without interrupting communications.

FIG. 4 illustrates an embodiment of a procedure 400 for compensating for temperature variation in the phase locked loop (PLL) circuit of FIG. 1 without interrupting communications. After start of the procedure 400, in step 402 the threshold detector 128 is activated during a predetermined window of time in order to monitor the $V_{tune}$ signal to determine if $V_{tune}$ is beyond a predetermined acceptable voltage range. In a particular embodiment, the threshold detector 128 is activated approximately once every second to monitor the $V_{tune}$ signal. In other embodiments, the threshold detector 128 is activated in a range of once every 0.001 seconds to 5 seconds. In at least one embodiment, the predetermined voltage range includes a first threshold voltage value $V_{thL}$, and a second threshold voltage $V_{thH}$ wherein the first threshold voltage $V_{thL}$ is less than the second threshold voltage $V_{thH}$. In step 404, the threshold detector determines whether $V_{tune}$ is less than $V_{thL}$. If $V_{tune}$ is less than $V_{thL}$, the digital control unit 130 decreases the digital compensation signal CALTEMP by one least significant bit (LSB) in step 406. If it is determined in step 404 that $V_{tune}$ is not less than $V_{thL}$ the procedure continues to step 408. In step 408 it is determined whether $V_{tune}$ is greater than $V_{thH}$. If it is determined in step 408 that $V_{tune}$ is not greater than $V_{thH}$, the digital compensation signal CALTEMP remains unchanged from its previous value, which remains memorized within the DAC 132, the analog compensation signal $V_{comp}$ is maintained at its current value after digital to analog conversion and filtering, and the procedure ends. If it is determined in step 408 that $V_{tune}$ is greater than $V_{thH}$, the procedure continues to step 410. In step 410, the digital control unit 130 increases the digital compensation value CALTEMP by one least significant bit (LSB).

It should be understood that the above described step 406 in which the digital compensation signal CALTEMP is decremented when $V_{tune}$ is less than $V_{thL}$ is performed when the PLL is configured such that the gain of the VCO 102 and the gain of the digital control unit 130 have the same sign. In embodiments in which the gain of the VCO 102 and the gain of the digital control unit 130 have difference signs, the digital compensation signal is incremented when the voltage of the error signal is less than $V_{thL}$. Similarly, the above-described step 410 in which digital compensation signal CALTEMP is increased when $V_{tune}$ is greater than $V_{thH}$ is performed when the PLL is configured such that the gain of the VCO 102 and the gain of the digital control unit 130 have the same signs. In embodiments in which the gain of the VCO 102 and the gain of the digital control unit 130 have difference signs, the digital compensation signal CALTEMP is decremented when the voltage of the error signal $V_{tune}$ is greater than the second threshold voltage value $V_{thH}$.

Still referring to FIG. 4, after performing of either of step 406 or step 410 described above, the procedure continues to step 412. In step 412 the DAC 132 converts the digital compensation signal CALTEMP to an analog compensation signal. In step 414, the analog compensation signal is filtered by the filter 134 to produce a filtered analog compensation signal $V_{comp}$. During this compensation mode the filter 134 low pass filters the analog compensation signal to suppress DAC noise and to avoid large transient frequency errors. In step 416, the filtered analog compensation signal is provided to the voltage controlled oscillator 102 and the VCO 102 adjusts the output frequency $F_{VCO}$ in accordance with the filtered analog compensation signal. In this state, the PLL will compensate for low frequency drift, such as that caused by temperature variations, by adjusting the error signal $V_{tune}$ voltage back within the desired boundaries. For example, if $V_{tune}$ is too high, $V_{comp}$ is increased and the output frequency $F_{VCO}$ of the VCO 102 increases assuming the VCO gain is positive. In order to maintain the output frequency $F_{VCO}$ of the VCO 102 at the desired frequency, the PLL will decrease $V_{tune}$.

Figure 5:
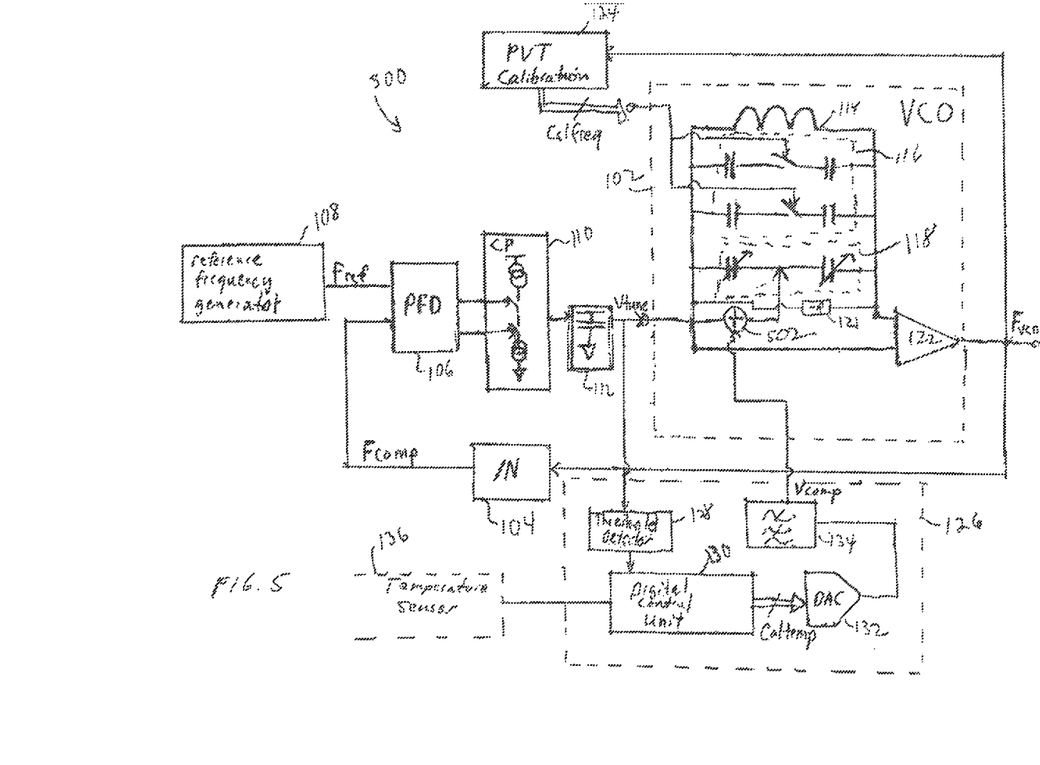
FIG. 5 illustrates an alternative embodiment of circuitry for compensating for temperature variation in a phase locked loop (PLL) without interrupting existing communications.

FIG. 5 illustrates an alternative embodiment of circuitry 500 for compensating for temperature variation in a phase locked loop (PLL) without interrupting existing communications. In the embodiment illustrated in FIG. 1, temperature effects were corrected by controlling a compensation varactor bank 120 using the analog compensation signal $V_{comp}$. In the embodiment illustrated in FIG. 5, the compensation varactor bank 120 of FIG. 1 is replaced with a voltage adder 502. The voltage adder 502 adds the voltages of $V_{tune}$ and $V_{comp}$ and provides the added signal as a control signal to the varactor bank 118. Otherwise, the controller 126 operates in an analogous manner as that of FIG. 1. In the embodiment illustrated in FIG. 5, the voltage adder 502 must accept an output voltage higher than the charge pump output and it is desired that it have a low noise. In still another embodiment, the circuitry 500 may be further provided with a temperature sensor 136 to provide a measure of ambient temperature to the digital control unit 130. As described with respect to FIG. 1, the use of the optional temperature sensor 136 may be used to increase the temperature operating range of the controller 126 by presetting CALTEMP according to the measured temperature.

Figure 6:
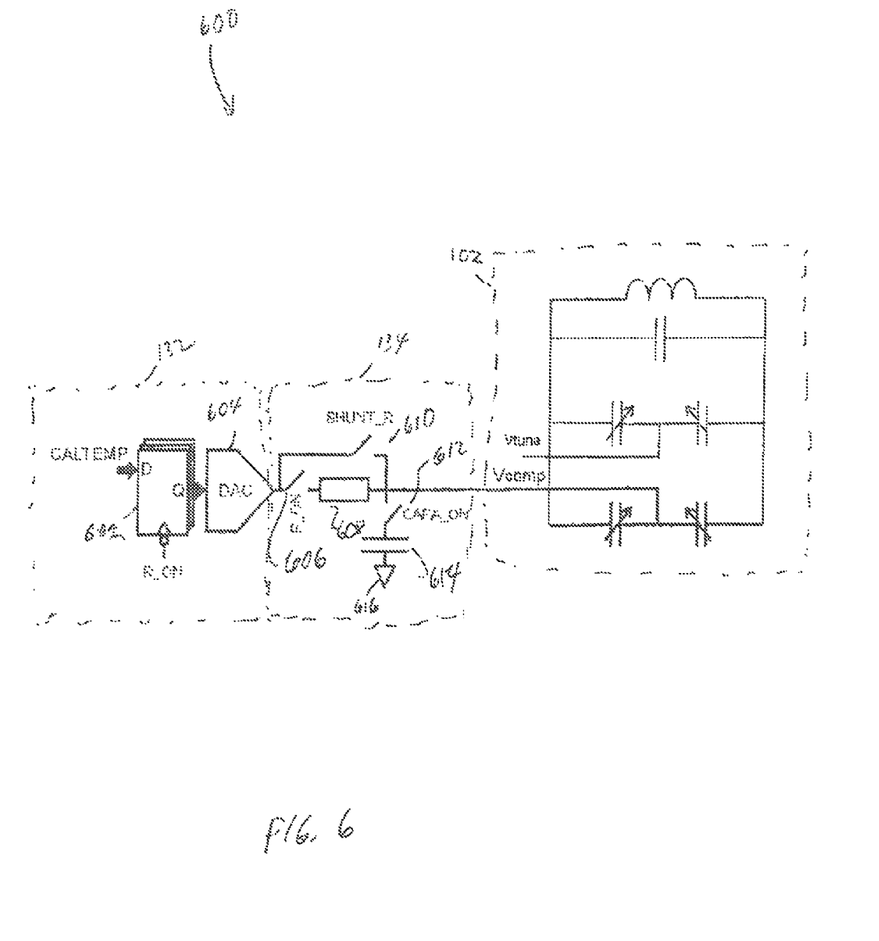
FIG. 6 illustrates an embodiment switchable bandwidth filter circuitry of the DAC and filter of FIGS. 1 and 5.

FIG. 6 illustrates an embodiment switchable bandwidth filter circuitry 600 of the DAC 132 and filter 134 of FIGS. 1 and 5. In the embodiment illustrated in FIG. 6, the filter 134 is a switchable bandwidth filter configured to be switchable between an open loop VCO calibration mode in which the filter is disabled, a PLL settling mode in which the filter is configured for a large bandwidth, and a closed loop compensation mode in which a low-pass filter is enabled. The DAC 132 includes a D flip-flop 602 configured to receive the digital compensation signal CALTEMP from the digital control unit 130 at the D input of the D flip-flop, and a digital-to-analog converter 604 configured to receive a resampled digital compensation signal CALPTEMP from the D flip-flop 602. The D flip-flop 602 further includes a clock input that receives a control signal R_ON from the digital control unit 130. The filter 134 includes a first switch 606 coupled between the output of the DAC 604 and a filter resistor 608. The filter 134 further includes a second switch 610 in parallel with the filter resistor 608. The filter 134 further includes a third switch 612 coupled between the second end of the filter resistor 608 and a filter capacitor 614. A second end of the filter capacitor 614 is coupled to a ground potential 616. The first switch 606 is configured to be controlled by the first control signal R_ON from the digital control unit 130. The second switch 610 is configured to be controlled by a second control signal SHUNT_R provided from the digital control unit, and the third switch is configured to be controlled by a third CAPA_ON provided from the digital control unit 130. The DAC 132 memorizes the digital compensation signal CALTEMP by the D flip-flop 602, and the DAC 132 output is filtered by the filter 134 to provide the filtered analog compensation signal $V_{comp}$ to the VCO 102. The first control signal R_ON, the second control signal SHUNT_ON and the third control signal CAPA_ON generated by the digital control unit 130 allow the switching of the filter 134 between the open loop VCO calibration mode in which the filter is disabled, the PLL settling mode in which the filter is configured for a large bandwidth and a closed loop compensation mode in which the filter is enabled as a low-pass filter as will be further described with respect to FIG. 7 and FIG. 8.

Figure 7:
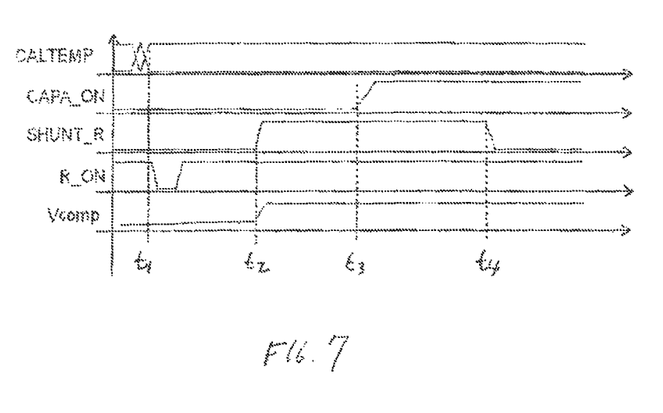
FIG. 7 illustrates an embodiment of a timing diagram for the control signals of the DAC and filter of FIG. 6 during open loop PVT calibration mode.

FIG. 7 illustrates an embodiment of a timing diagram for the control signals of the DAC 132 and filter 134 of FIG. 6 during open loop PVT calibration mode. At a time $t_1$, the digital compensation signal CALTEMP is resampled on the falling edge of the first control signal R_ON. To avoid glitches due to digital bus switching, the filter resistor 608 is disabled during a predetermined short time period by setting the first control signal R_ON to zero which causes the opening of the first switch 606. After this short time period, the first control signal R_ON is set equal to 1. During the open loop calibration mode, the filter resistor 608 is shunted by setting the second control signal SHUNT_R=1 thus closing the second switch 610 at time $t_2$. The filtered analog compensation signal $V_{comp}$ ramps upward at time $t_2$ and maintains a constant value. In addition, the filter capacitor 614 is disconnected by setting the third control signal CAPA_ON=0, thus opening the third switch 612. This configuration of the filter 134 allows the filter settling time to be reduced. At the end of the PVT calibration procedure, the analog loop is closed. In a particular embodiment, the settling time of the PLL is approximately 100 microseconds. During a portion of this settling time, the filter capacitor 614 is charged by setting the third control signal CAPA_ON=1, thus closing the third switch 612 at time t3. Before the end of the PLL settling time, the DAC noise is now a concern so all of the filtering capabilities of the filter 134 are enabled by setting the second control signal SHUNT_R=0 at time $t_4$ and maintaining the first control signal R_ON=1. Thus the filter resistor 608 and the filter capacitor 614 are enabled during this time.

Figure 8:
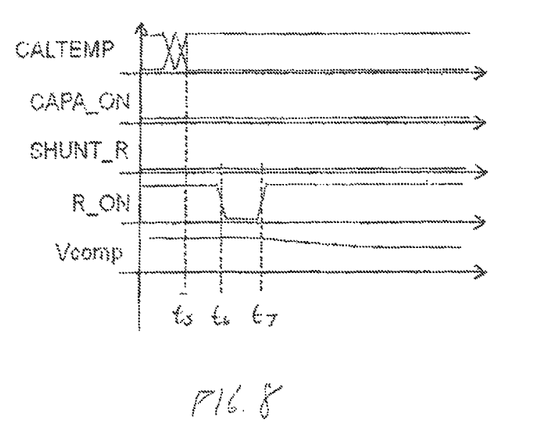
FIG. 8 illustrates an embodiment of a timing diagram of control signals for the DAC and filter of FIG. 6 during a closed loop compensation mode.

FIG. 8 illustrates an embodiment of a timing diagram of control signals for the DAC 132 and filter 134 of FIG. 6 during a closed loop compensation mode. During the closed loop low frequency drift compensation mode, the digital compensation signal CALTEMP is updated according to the procedure described herein at a time $t_5$. In the embodiment illustrated in FIG. 8, a downward adjustment of CALTEMP is illustrated. At time $t_6$, the digital compensation signal CALTEMP is sampled at the falling edge of the first control signal R_ON and the DAC 604 is disconnected from the filter 134 by the setting of the first control signal R_ON=0 and the setting of the second control signal SHUNT_R=0 which opens the first switch 606 and second switch 610, respectively. As a result, the previous voltage value is memorized by the filter capacitor 614 in a memorization mode of the filter 134. The output of the DAC 604 is then updated. After a delay higher than the DAC settling time, the DAC 604 is reconnected to the filter 132 by setting the first control signal R_ON=1 at time t7, thus closing the first switch 606. As a result a smooth transition is produced in the filtered analog compensation signal $V_{comp}$ due to the low cut-off frequency of the filter 134.

Some embodiments of the invention provide advantages over other methods that may be used to attempt to compensate for temperature variation in a PLL. One method that may be attempted to compensate for temperature variation is to increase the VCO gain. By increasing the VCO gain without modifying the VCO temperature coefficient, an extended temperature locking range may be produced. However a drawback of this method is that in order to maintain loop stability it is necessary to increase proportionally the loop filter capacitor are which may account for as much as 30% of the PLL area. In addition, VCO noise increases proportionally with VCO gain. Another method that may be used to attempt to compensate for temperature variation in a PLL is to update the digital control word CALFREQ of the PVT calibration mode. By measuring the $V_{tune}$ voltage it may be determined whether the $V_{tune}$ voltage is outside of an acceptable range. The $V_{tune}$ voltage may be then brought back into an accepted range by adding or subtracting one least significant bit (LSB) of the CALFREQ digital control word. However, a drawback of this method is that switching a LSB of a digitally-controlled capacitor bank may create phase discontinuities and if the update is made during operation communications may be lost. To respect the minimum allowable frequency drift during a communication, for example 0.1 ppm, a very large capacitor bank with major impact upon the PLL area is required. In a worse case, changing a least significant bit may possibly change a course caliber due to digitally-controlled capacitor bank overlapping and causing the PLL to be unlocked. Still another method that may used to attempt to compensate for temperature variation is to modifying the charge pump by increasing the charge pump power supply to have an extended $V_{tune}$ range and an extended temperature locking range. A drawback of this method is that by increasing the charge pump power supply, a degradation of power supply rejection results which requires the use of a technology that supports a larger power supply. Still another method that may be used for attempting to compensate for temperature variation is to use a temperature dependant signal to provide open loop VCO temperature compensation. A major drawback to this method is that it is requires a good knowledge of the VCO temperature coefficient for different processes during chip manufacture such that it must be performed on a chip-by-chip basis.

It will be appreciated by those skilled in the art having the benefit of this disclosure provides a method and apparatus for compensating for temperature variation in a phase locked loop (PLL) without interrupting communications and without the need for temperature information provided from a temperature sensor. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A method for compensating for temperature variation in a phase locked loop (PLL), the method comprising:
   receiving an error signal by a controller, the error signal representative of an instantaneous frequency difference between a reference frequency signal and an output frequency signal of a voltage controlled oscillator of the phase locked loop (PLL);
   determining whether a voltage of the error signal is outside of a predetermined voltage range;
   when the voltage is outside the predetermined voltage range:
      generating a new digital compensation signal by a controller based upon a previous digital compensation signal, the new digital compensation signal representative of a calibration signal for the voltage controlled oscillator; and
      converting, by a digital to analog converter, the new digital compensation signal to be an analog compensation signal; and
   when the voltage is within the predetermined voltage range:
      maintaining the previous digital compensation signal by the controller; and
      converting, by a digital to analog converter, the previous digital compensation signal to be the analog compensation signal;
   filtering the analog compensation signal by a switchable bandwidth filter to produce a filtered analog compensation signal; and
   adjusting the output frequency of the voltage controlled oscillator in accordance with the filtered analog compensation signal.

2. The method of claim 1, wherein the predetermined voltage range includes a first threshold voltage value and a second threshold voltage value, the first threshold voltage value being less than the second threshold voltage value.

3. The method of claim 2, wherein when the voltage of the error signal is less than the first threshold voltage value, the step of generating further includes decrementing the previous digital compensation signal to produce the new digital compensation signal when a gain of the voltage controlled oscillator and a gain of the controller have the same signs, and incrementing the previous digital compensation signal to produce the new digital compensation signal when a gain of the voltage controlled oscillator and a gain of the controller have different signs.

4. The method of claim 3, wherein the decrementing or incrementing of the previous digital compensation signal occurs during a predetermined time period in a memorization mode of the switchable bandwidth filter.

5. The method of claim 3, wherein decrementing the previous digital compensation signal includes decrementing the previous digital compensation signal by one least significant bit (LSB), and incrementing the previous digital compensation signal includes incrementing the previous digital compensation signal by one least significant bit (LSB).

6. The method of claim 2, wherein when the voltage of the error signal is greater than the second threshold voltage value, the step of generating further includes incrementing the previous digital compensation signal to produce the new digital compensation signal when a gain of the voltage controlled oscillator and a gain of the controller have the same signal, and decrementing the previous digital compensation signal to produce the new digital compensation signal when a gain of the voltage controlled oscillator and a gain of the controller have different signs.

7. The method of claim 1, wherein the step of adjusting the output frequency of the voltage controlled oscillator includes adjusting the voltage of the error signal in accordance with the filtered analog compensation signal.

8. The method of claim 1, wherein the step of adjusting the output frequency of the voltage controlled oscillator includes adjusting at least one voltage controlled capacitance of the voltage controlled oscillator in accordance with the filtered analog compensation signal.

9. The method of claim 8, wherein the at least one voltage controlled capacitance comprises at least one varactor.

10. The method of claim 1, wherein the step of adjusting the output frequency of the voltage controlled oscillator includes adding the filtered analog compensation signal to the error signal.

11. The method of claim 1, wherein the filtering comprises low-pass filtering the analog compensation signal.

12. The method of claim 1, further comprising:
   providing a temperature signal to the controller, the temperature signal indicative of a temperature measured by a temperature sensor; and
   setting a value of the previous digital compensation signal in accordance with the temperature signal.

13. The method of claim 1, further comprising switching the switchable bandwidth filter between an open-loop VCO calibration mode in which the switchable bandwidth filter is disabled, a PLL settling mode in which the switchable bandwidth filter is configured for a predetermined bandwidth, and a closed-loop compensation mode in which the switchable bandwidth filter is enabled.

14. The method of claim 1, wherein a cut-off frequency of the switchable bandwidth filter is lower than a bandwidth of the PLL.

15. The method of claim 1, further comprising receiving a control signal by the controller, wherein the generating of the new digital compensation signal by the controller is performed in response to receiving the control signal.

16. The method of claim 15, further comprising generating the control signal in response to determining that the voltage of the error signal is outside of a predetermined voltage range.

17. An apparatus having a phase locked loop comprising:
a voltage controlled oscillator of the phase locked loop (PLL), the voltage controlled oscillator configured to output an output frequency signal in accordance with an error signal, the error signal representative of an instantaneous frequency difference between a reference frequency signal and the output frequency signal of the voltage controlled oscillator;
a controller configured to:
receive the error signal; and
determine whether a voltage of the error signal is outside of a predetermined voltage range; and
when the voltage is outside the predetermined voltage range, the controller is further configured to:
generate a new digital compensation signal based upon a previous digital compensation signal, the new digital compensation signal representative of a calibration signal for the voltage controlled oscillator; and
convert, using a digital to analog converter, the new digital compensation signal to be an analog compensation signal; and
when the voltage is within the predetermined voltage range, the controller is further configured to:
maintain the previous digital compensation signal; and
convert, using a digital to analog converter, the previous digital compensation signal to be the analog compensation signal;
a switchable bandwidth filter configured to receive the analog compensation signal from the controller and filter the analog compensation signal to produce a filtered analog compensation signal; and
wherein the voltage controlled oscillator is further configured to adjust the output frequency in accordance with the filtered analog compensation signal.

18. The apparatus of claim 17, wherein the predetermined voltage range includes a first threshold voltage value and a second threshold voltage value, the first threshold voltage value being less than the second threshold voltage value.

19. The apparatus of claim 18, wherein when the voltage of the error signal is less than the first threshold voltage value, the generating includes decrementing the previous digital compensation signal to produce the new digital compensation signal when a gain of the voltage controlled oscillator and a gain of the controller have the same signs, and incrementing the previous digital compensation signal to produce the new digital compensation signal when a gain of the voltage controlled oscillator and a gain of the controller have different signs.

20. The apparatus of claim 19, wherein the decrementing or incrementing of the previous digital compensation signal occurs during a predetermined time period in a memorization mode of the switchable bandwidth filter.

21. The apparatus of claim 19, wherein decrementing the previous digital compensation signal includes decrementing the previous digital compensation signal by one least significant bit (LSB), and incrementing the previous digital compensation signal includes incrementing the previous digital compensation signal by one least significant bit (LSB).

22. The apparatus of claim 18, wherein when the voltage of the error signal is greater than the second threshold voltage value, the generating includes incrementing the previous digital compensation signal to produce the new digital compensation signal when a gain of the voltage controlled oscillator and a gain of the controller have the same signs, and decrementing the previous digital compensation signal to produce the new digital compensation signal when a gain of the voltage controlled oscillator and a gain of the controller have different signs.

23. The apparatus of claim 17, wherein adjusting the output frequency of the voltage controlled oscillator includes adjusting the voltage of the error signal in accordance with the filtered analog compensation signal.

24. The apparatus of claim 17, further comprising at least one voltage controlled capacitance coupled to the voltage controlled oscillator, wherein adjusting the output frequency of the voltage controlled oscillator includes adjusting the at least one voltage controlled capacitance in accordance with the filtered analog compensation signal.

25. The apparatus of claim 24, wherein the at least one voltage controlled capacitance comprises at least one varactor.

26. The apparatus of claim 17, wherein the step of adjusting the output frequency of the voltage controlled oscillator includes adding the filtered analog compensation signal to the error signal.

27. The apparatus of claim 17 further comprising:
a temperature sensor coupled to the controller, the temperature sensor configured to provide a temperature signal to the controller, the temperature signal indicative of a temperature measured by the temperature sensor; and
wherein the controller is further configured to set a value of the previous digital compensation signal in accordance with the temperature signal.

28. The apparatus of claim 17, wherein the controller is further configured to switch the switchable bandwidth filter between an open-loop VCO calibration mode in which the switchable bandwidth filter is disabled, a PLL settling mode in which the switchable bandwidth filter is configured for a predetermined bandwidth, and a closed-loop compensation mode in which the switchable bandwidth filter is enabled.

29. The apparatus of claim 17, wherein the switchable bandwidth filter comprises a low-pass filter.

30. The apparatus of claim 17, wherein a cut-off frequency of the switchable bandwidth filter is lower than a bandwidth of the PLL.

31. The apparatus of claim 17, wherein the controller is further configured to receive a control signal, wherein the generating of the new digital compensation signal by the controller is performed in response to receiving the control signal.

32. The apparatus of claim 31, wherein the control signal is generated in response to determining that the voltage of the error signal is outside of a predetermined voltage range.

* * * * *